(12) United States Patent
    Takahashi et al.

(10) Patent No.: US 11,373,874 B2
(45) Date of Patent: Jun. 28, 2022

(54) ETCHING METHOD AND APPARATUS

(71) Applicant: TOKYO ELECTRON LIMITED, Tokyo (JP)

(72) Inventors: Nobuhiro Takahashi, Yamanashi (JP); Ayano Hagiwara, Yamanashi (JP); Yasuo Asada, Yamanashi (JP); Tatsuya Yamaguchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/825,227

(22) Filed: Mar. 20, 2020

(65) Prior Publication Data

US 2020/0312669 A1    Oct. 1, 2020

(30) Foreign Application Priority Data

Mar. 29, 2019 (JP) .............................. JP2019-066761

(51) Int. Cl.
    *H01L 21/311* (2006.01)
    *H01L 21/3065* (2006.01)
    *H01L 21/308* (2006.01)

(52) U.S. Cl.
    CPC ........ *H01L 21/3065* (2013.01); *H01L 21/308* (2013.01)

(58) Field of Classification Search
    CPC ..................... H01L 21/02664; H01L 21/31116
    See application file for complete search history.

(56) References Cited

U.S. PATENT DOCUMENTS

| 2006/0183055 | A1* | 8/2006 | O'Neill ............. H01L 21/31144 430/316 |
| 2018/0158693 | A1* | 6/2018 | Yatsuda ............ H01L 21/31111 |
| 2018/0166255 | A1* | 6/2018 | Blomberg ......... H01L 21/32135 |
| 2019/0198349 | A1* | 6/2019 | Asada ................... H01L 21/768 |

FOREIGN PATENT DOCUMENTS

| JP | 2007-258586 A | 10/2007 |
| JP | 4940722 B2 | 5/2012 |
| JP | 2016-63141 A | 4/2016 |
| KR | 10-2018-0065925 A | 6/2018 |

* cited by examiner

*Primary Examiner* — Thomas T Pham
(74) *Attorney, Agent, or Firm* — Fenwick & West LLP

(57) ABSTRACT

An etching method for etching a silicon-containing film formed in a substrate by supplying an etching gas to the substrate is provided. The method includes supplying an amine gas to the substrate, in which the silicon-containing film, a porous film, and a non-etching target film that is a film not to be etched but is etchable by the etching gas are sequentially formed adjacent to each other, so that amine is adsorbed onto walls of pores of the porous film. The method further includes supplying the etching gas for etching the silicon-containing film to the substrate in which the amine is adsorbed onto the walls of the pores of the porous film.

10 Claims, 14 Drawing Sheets

2-1 (tert-butylamine)  2-2 (tert-butyl isocyanate)

BEFORE SUPPLY OF IF$_7$ GAS

AFTER SUPPLY OF IF$_7$ GAS

ANNEALING AT 200°C FOR 5 MINUTES

ETCHING METHOD AND APPARATUS

CROSS-REFERENCE TO RELATED APPLICATIONS

This application claims priority to Japanese Patent Application No. 2019-066761, filed on Mar. 29, 2019, the entire contents of which are incorporated herein by reference.

TECHNICAL FIELD

The present disclosure relates to an etching method and apparatus.

BACKGROUND

An interlayer insulating film having therein a wiring constituting a semiconductor device may be formed of a low dielectric constant film referred to as a "low-k film." The low-k film may be, e.g., a porous film, for example. In a semiconductor device manufacturing process, etching may be performed on a semiconductor wafer (hereinafter, referred to "wafer") having such a porous film.

For example, Japanese Patent Application Publication No. 2016-63141 discloses a technique for performing etching on a wafer having an interlayer insulating film that is a low-k film and forming a recess for embedding a wiring. A film forming gas is supplied to form a film in the recess in order to prevent the recess from being exposed to the atmosphere until the wiring is embedded in the recess. Further, Japanese Patent No. 4940722 discloses a technique for etching an organic film embedded in a recess formed in a low-k film that is a porous film using plasma of a processing gas containing a predetermined amount of carbon dioxide.

The present disclosure provides a technique capable of preventing an etching gas from passing through pores of a porous film to prevent the etching of a film not to be etched.

SUMMARY

In accordance with an aspect of the present disclosure, there is provided an etching method for etching a silicon-containing film formed in a substrate by supplying an etching gas to the substrate, the method including: supplying an amine gas to the substrate in which the silicon-containing film, a porous film, and a non-etching target film that is a film not to be etched but is etchable by the etching gas are sequentially formed adjacent to each other, so that amine is adsorbed onto walls of pores of the porous film; and supplying the etching gas for etching the silicon-containing film to the substrate in which the amine is adsorbed onto the walls of the pores of the porous film.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
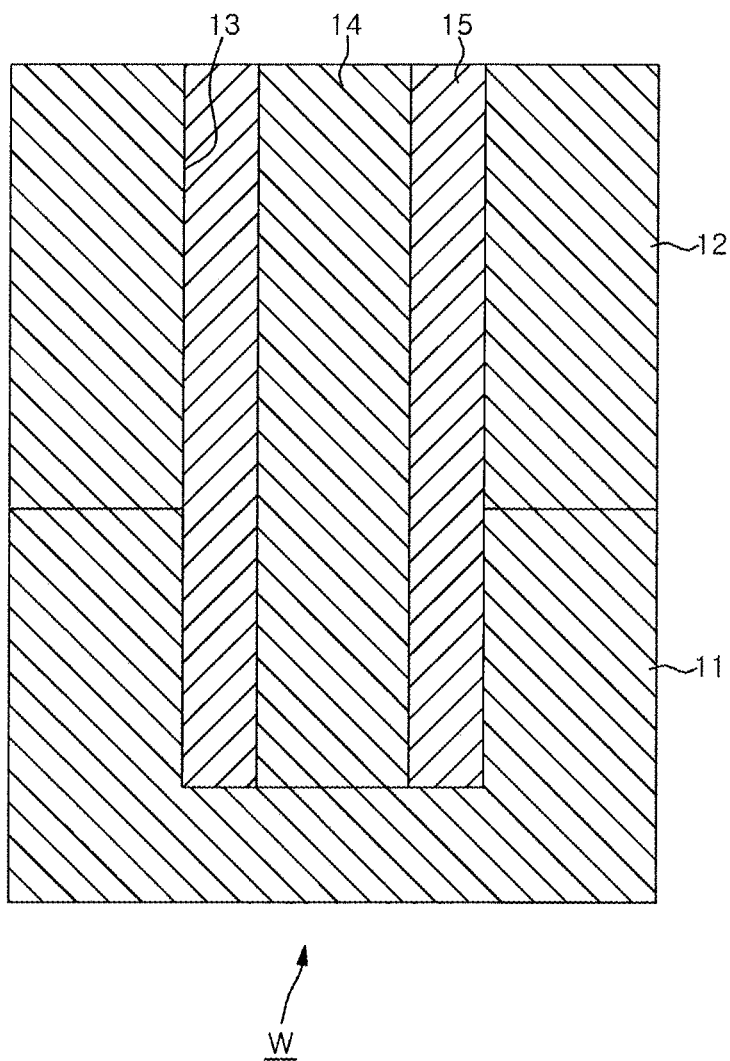
FIG. 1 is a longitudinal cross-sectional view of a surface of a wafer on which etching according to an embodiment is performed.

Hereinafter, a process in the etching method according to an embodiment of the present disclosure will be described. FIG. 1 is a longitudinal cross-sectional view of a surface of a wafer W on which the process is performed. In FIG. 1, a reference numeral '11' denotes a silicon germanium (SiGe) film. A silicon oxide ($SiO_x$) film 12 is stacked on the SiGe film 11. A recess 13 is formed in the stacked body of the silicon oxide film 12 and the SiGe film 11. A polysilicon film 14 is embedded in the recess 13. Further, a SiOCN film 15, i.e., a film including silicon, oxygen, nitrogen, and carbon, is formed between a sidewall of the polysilicon film 14 and a sidewall of the recess 13 so as to surround the side portion of the polysilicon film 14. The SiOCN film 15 is in contact with the sidewall of the polysilicon film 14 and the sidewall of the recess 13. Therefore, the polysilicon film 14, the SiOCN film 15, and the SiGe film 11 are formed adjacent to each other in that order when viewed in a lateral direction (horizontal direction). The SiOCN film 15 is an interlayer insulating film and a porous film. The polysilicon film 14 is an etching target film (a film to be etched), and the SiGe film 11 is a non-etching target film (a film not to be etched). The silicon oxide film 12 serves as an etching mask film when etching the polysilicon film 14.

The outline of processes according to the present embodiment will be briefly explained. In the case of removing the polysilicon film 14, a supply of an amine gas to the wafer W and a supply of an etching gas containing a chlorine trifluoride ($ClF_3$) gas to the wafer W are alternately repeated. On the assumption that the polysilicon film 14 is etched without supplying the amine gas, the etching gas passes through the pores of the SiOCN film 15 and is supplied to the sidewall of the SiGe film 11 during the etching of the polysilicon film 14, thereby etching the sidewall of the SiGe film 11. In other words, the polysilicon film 14 and the SiGe film 11 are etchable by etching gas. The amine gas is supplied to prevent the etching gas from passing through the pores of the SiOCN film 15 to prevent the SiGe film 11 from being etched. In the following description, the gas supply for preventing the passage of the etching gas may be referred to as the "sealing process." Japanese Patent Application Publication No. 2016-63141 and Japanese Patent No. 4940722 do not disclose the techniques of etching the polysilicon film 14 among the polysilicon film 14, the SiOCN film 15, and the SiGe film 11 arranged adjacent to each other. Further, the techniques disclosed therein do not provide a solution for the problem in that the sidewall of the SiGe film 11 is etched when etching the polysilicon film 14.

The etching of the SiGe film 11 is suppressed by the supply of the amine gas due to the following reasons. Amine has a relatively high basicity, and thus is relatively easily adsorbed onto an oxygen-containing film. Therefore, a relatively large amount of the amine supplied to the wafer W is adsorbed onto the surface of the SiOCN film 15. In other words, a relatively large amount of the amine is adsorbed onto the walls of the pores of the SiOCN film 15, so that the pores are sealed. Accordingly, the etching gas is prevented from being supplied to the SiGe film 11 through the pores.

As will be described in detail in evaluation tests to be described later, amine relatively easily reacts with $ClF_3$ forming the etching gas. Due to this reaction, the etching property of the etching gas supplied to the pores of the SiOCN film 15 with respect to the SiGe film 11 disappears. The pores are sealed by, in addition to the amine, reaction products generated in the pores by the reaction between the amine and the $ClF_3$. Therefore, the etching gas is prevented from passing through the pores. Although the amine is supplied in a gaseous state to the wafer W, the amine may be in a liquid state or a solid state when it is adsorbed onto the pores. The state of the amine may be different between when it is supplied to the wafer W and when it stays in the pores.

Next, the processes performed on the wafer W will be described sequentially with reference to FIGS. 2A to 2D and FIGS. 3A to 3D. FIGS. 2A to 2D and FIGS. 3A to 3D schematically show states in which the surface portion of the wafer W shown in FIG. 1 is changed with the processes. The processes shown in FIGS. 2A to 2D and FIGS. 3A to 3D are performed in a state where the wafer W is loaded into a processing chamber and the inner space of the processing chamber is exhausted to be a vacuum atmosphere of a predetermined pressure. In FIGS. 2A to 2D and FIGS. 3A to 3D, a reference numeral '16' denotes each pore formed in the SiOCN film 15 and a reference numeral '21' denotes amine. In this example, the amine 21 is hexylamine ($C_6H_{15}N$). The state of the amine 21 may be different between the inside of the pores 16 and the outside of the pores 16 as described above. However, in FIGS. 2A to 2D and FIGS. 3A to 3D, the state of the amine is not distinguished. In this example, a reference numeral '22' denotes a $ClF_3$ gas that is an etching gas.

Figure 2A:
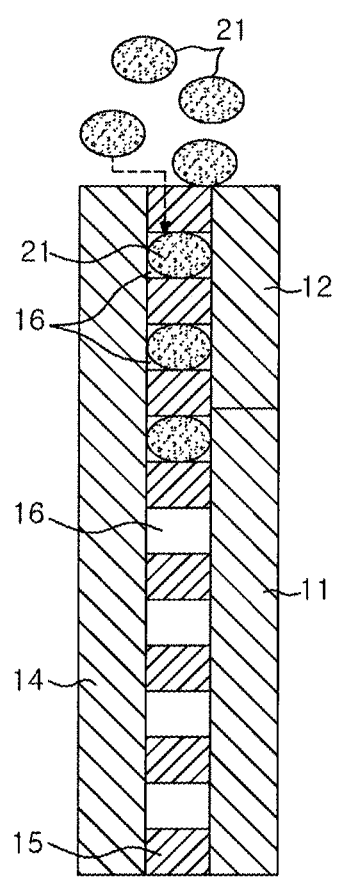
FIGS. 2A to 2D are process diagrams for explaining the etching.
Figure 2B:
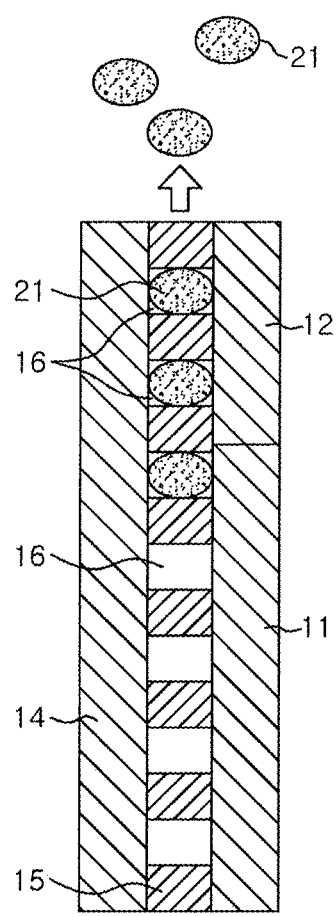

First, the gaseous amine 21 (amine gas) is supplied into the processing chamber to perform a sealing process (step S1; FIG. 2A). As described above, the amine 21 is relatively easily adsorbed onto the SiOCN film 15 and, thus, a relatively large amount of the amine 21 is adsorbed onto the respective walls of the pores 16 and stays in the pores 16. Then, the supply of the amine 21 into the processing chamber is stopped, and the exhaust of the processing chamber and the supply of a purge gas, e.g., nitrogen ($N_2$) into the processing chamber are performed (step S2, FIG. 2B). The amine 21 that has not been supplied into the pores 16 is removed with an air flow of the purge gas that is being exhausted.

Figure 2C:
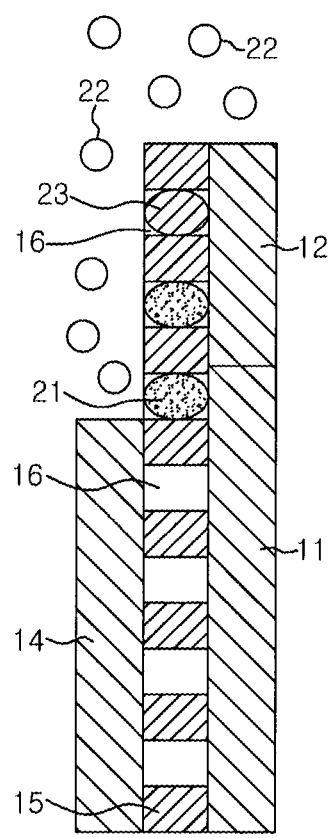
Figure 2D:
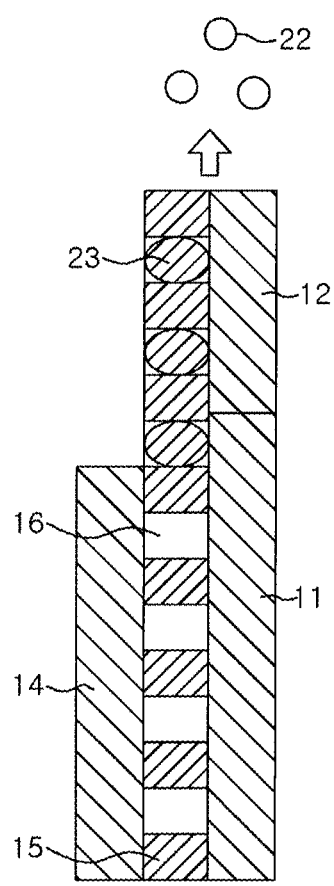

Next, the etching gas 22 is supplied into the processing chamber, so that the polysilicon film 14 is etched and the sidewall of an upper portion of the SiOCN film 15 is exposed (step S3, FIG. 2C). At this time, the amine 21 stays in the pores 16 of the upper portion of the SiOCN film 15. Further, as described above, the etching gas 22 reacts with the amine 21 to generate reaction products 23 and, thus, is prevented from reaching the SiGe film 11. The reaction products 23 thus generated prevent the etching gas 22 continuously supplied to the SiOCN film 15 from passing through the pores 16 and further being supplied to the SiGe film 11. Then, the supply of the etching gas 22 into the processing chamber is stopped, and the exhaust of the processing chamber and the supply of the purge gas into the processing chamber are performed (step S4, FIG. 2D). Therefore, the etching gas 22 remaining in the processing chamber is removed from the processing chamber with an air flow of the purge gas that is being exhausted.

Figure 3A:
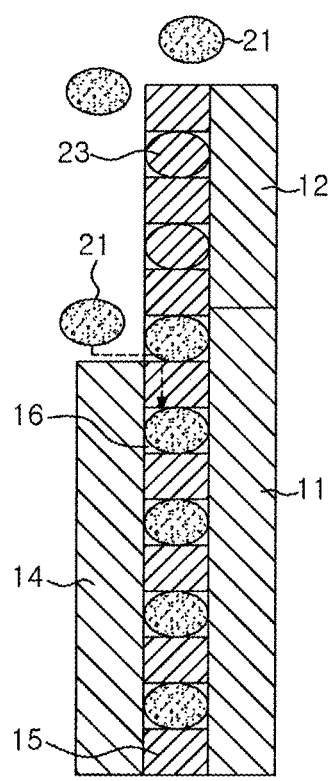
FIGS. 3A to 3D are process diagrams for explaining the etching.

Thereafter, the gaseous amine 21 is supplied into the processing chamber. In other words, step S1 is executed again. In previous step S3, the polysilicon film 14 is etched and the sidewall of the upper portion of the SiOCN film 15 is exposed. Therefore, the amine 21 supplied in step S1 in the second cycle is supplied to the pores 16 in the SiOCN film 15 which are positioned below the pores 16 into which the amine 21 has been supplied in step S1 in the first cycle, and is adsorbed onto the walls thereof (FIG. 3A).

Figure 3B:
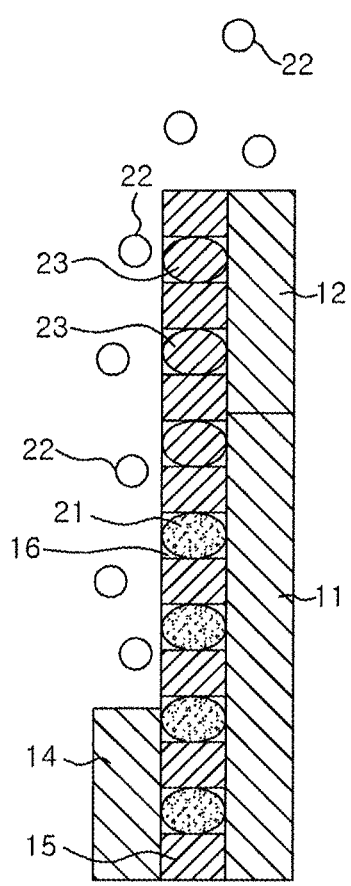

Next, the exhaust of the processing chamber and the supply of the purge gas into the processing chamber in step S2 are performed again. Then, the etching gas 22 is supplied into the processing chamber in step S3. Accordingly, the polysilicon film 14 is further etched downward, and the exposed region on the sidewall of the SiOCN film 15 is extended downward. Since the region of the SiOCN film 15 where the amine 21 is supplied is extended downward through step S1 in the second cycle, the pores 16 in the vicinity of the sidewall of the SiOCN film 15, which are newly exposed by the etching of the polysilicon film 14, are filled with the amine 21. Therefore, even in step S3 in the second cycle, the etching gas can also be prevented from passing through the pores 16 of the SiOCN film 15 and the etching of the sidewall of the SiGe film 11 can be prevented (FIG. 3B). After the etching, the exhaust of the processing chamber and the supply of the purge gas into the processing chamber in step S4 are performed again.

A sequence of steps S1 to S4 performed in that order is set as one cycle, and the cycle is repeated even after step S4 in the second cycle is executed. As a result, the polysilicon film 14 is etched downward while preventing the etching of the sidewall of the SiGe film 11 by the amine 21 of which supply region is gradually extended toward a lower portion of the SiOCN film 15.

Figure 3C:
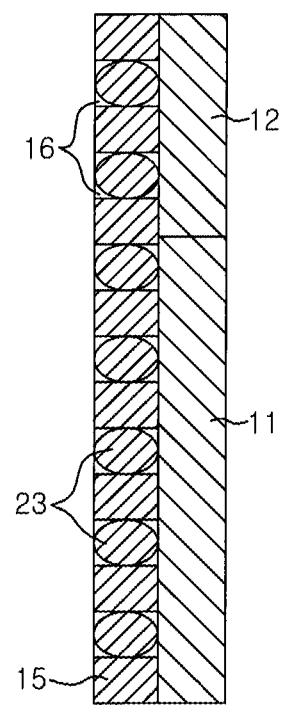
Figure 3D:
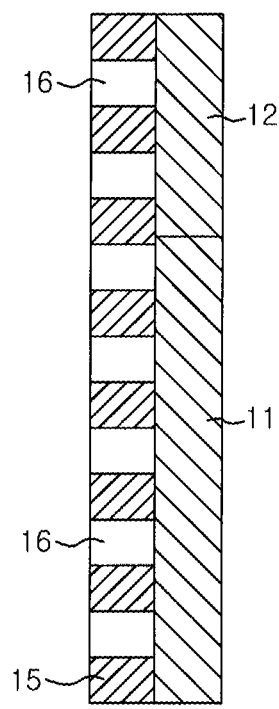
Figure 4:
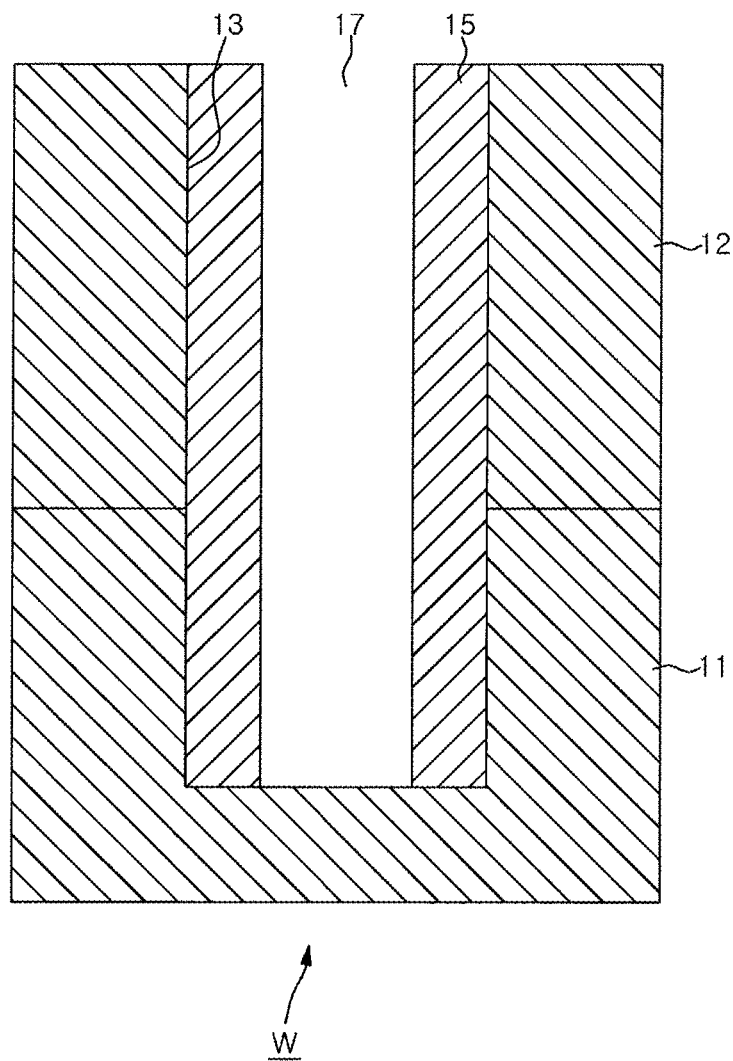
FIG. 4 is a longitudinal cross-sectional view of the surface of the wafer after the etching.

After the polysilicon film 14 is entirely etched and the cycle is repeated a predetermined number of time (FIG. 3C), the wafer W is heated (step S5). The heating is performed to vaporize and remove an unreacted amine 21 and the reaction products 23 in the SiOCN film 15 from the SiOCN film 15 as shown in FIG. 3D. In FIG. 3C, for the sake of convenience in illustration, the unreacted amine 21 is not illustrated and a state in which all the amine 21 has changed to the reaction products 23 is illustrated. Specifically, in step S5 of this example, the amine 21 is hexylamine, and the wafer W is heated to a temperature of 130° C. or higher because the boiling point of hexylamine is 130° C. or higher. FIG. 4 shows the wafer W from which the amine 21 and the reaction products 23 are removed by the etching of the polysilicon film 14 as described above. In a recess 17 formed by removing the polysilicon film 14, a gate of a semiconductor device is formed in a later step.

By performing the process according to the above-described embodiment, it is possible to etch the polysilicon film 14 using the etching gas while suppressing the sidewall of the SiGe film 11 from being etched by the etching gas. Here, as another example of the process for removing the polysilicon film 14, it may be considered to remove the upper portion of the polysilicon film by plasma-based anisotropic etching and then remove the lower portion of the polysilicon film 14 by wet etching. An etchant used for the wet etching has a relatively lower permeability with respect to the SiOCN film compared to the etching gas, so that the etching of the SiGe film 11 may be suppressed.

However, it is troublesome to switch the atmosphere around the wafer W from the vacuum atmosphere for performing the plasma processing to the atmospheric atmosphere for performing the wet etching. Further, the process may require a long period of time. In addition, the thickness of the sidewall of the SiOCN film 15 recently tends to be reduced. Therefore, if the thickness of the sidewall of the SiOCN film 15 is further reduced in the future, the permeability of the etchant to the SiOCN film 15 may be increased. In other words, the wet etching may lead to the etching of the SiGe film 11. On the other hand, in the processes according to the above-described embodiment illustrated in FIGS. 1 to 4, the etching of the SiGe film 11 can be more reliably suppressed while the period of time and effort required for the process is reduced.

Further, according to the process of the above-described embodiment, it is not necessary to use plasma, so that each film formed on the surface of the wafer W is not damaged by the plasma. Therefore, it is advantageous in that the reliability of the semiconductor devices formed on the wafer W can be improved. However, the present disclosure encompasses the case where the etching of the polysilicon film 14 is performed using plasma.

In evaluation tests to be described later, an example of a process in which amine and isocyanate are supplied and the pores 16 are sealed with a compound having a urea bond to prevent the etching gas from passing through the pores 16 is illustrated. However, in the above-described embodiment, only amine is supplied and, thus, the operation cost or the manufacturing cost of the processing apparatus can be reduced compared to the case where both amine and isocyanate are supplied.

In steps S1 to S4, the flow rate of the exhaust gas exhausted from the processing chamber may be constant. Further, the flow rates of the exhaust gases for removing unnecessary gases from the processing chamber in steps S2 and S4 may be greater than those in steps S1 and S3 in order to remove the gases in a more reliable manner. Alternatively, in steps S2 and S4, the unnecessary gases may be removed only by the exhaust operation without supplying the purge gas.

A silicon-containing film other than the polysilicon film 14 may be an etching target film that is a film to be etched. The silicon-containing film mainly contains silicon. Specifically, the silicon-containing film includes, e.g., an amorphous silicon film, a single-crystal silicon film, a SiGe film, or the like. The etching gas may be any gas capable of etching the silicon-containing film. Specifically, in addition to $ClF_3$ gas, examples of the etching gas may include a fluorine-containing gas such as fluorine ($F_2$) gas, iodine pentafluoride ($IF_5$) gas, bromine trifluoride ($BrF_3$) gas, iodine heptafluoride ($IF_7$) gas, or the like. It is preferable to use $IF_7$ gas since $IF_7$ gas has a relatively large molecular weight so that the $IF_7$ gas hardly passes through the pores 16 of the SiOCN film 15.

In the above-described embodiment, the non-etching target film that is a film not to be etched is the SiGe film 11. However, the non-etching target film may be, e.g., a Si film. Alternatively, the non-etching target film may be a film other than the silicon-containing film such as the Si film or the SiGe film 11. Further, the mask film formed on the SiGe film 11 is not limited to the silicon oxide film 12 as long as it can prevent the SiGe film 11 from being etched from the top thereof during the etching. For example, instead of the silicon oxide film 12, the SiOCN film 15 may be formed on the SiGe film 11. In other words, the SiOCN film 15 may be formed on the side surface and the upper surface of the SiGe film 11. In this case, when the etching gas is supplied to the wafer W, the amine gas is already adsorbed onto the SiOCN film 15 that is formed on the upper surface of the SiGe film 11. Therefore, the SiGe film 11 is prevented from being in contact with the etching gas from the upper surface of the SiGe film 11. Further, the porous film is not limited to the SiOCN film 15 and may be a SiCO film, a SiCOH film, or the like. As described above, the porous film preferably contains oxygen to adsorb amine. The oxygen contained in the porous film is not an impurity but a component of the porous film. For the amine 21, it is not limited to hexylamine and this will be described in detail later.

In the above-described example, the cycle of steps S1 to S4 is executed three times or more. However, the cycle of steps S1 to S4 may be executed twice or less. Further, in step S5, the wafer W is heated to remove the amine 21 and the reaction products 23 from the SiOCN film 15. However, the amine 21 and the reaction products 23 may remain in the respective pores 16 of the SiOCN film 15 as long as the dielectric constant of the SiOCN film 15 is practically acceptable even if the amine 21 and the reaction products 23 remain in the respective pores 16. Therefore, the heating in step S5 is not always necessary.

Hereinafter, a substrate processing apparatus 3 for performing the above-described series of processes will be described with reference to the plan view of FIG. 5. The substrate processing apparatus 3 includes a loading/unloading unit 31 for loading and unloading the wafer W, two load-lock chambers 41 arranged adjacent to the loading/unloading unit 31, two heat treatment modules 40 respectively arranged adjacent to the two load-lock chambers 41, and two etching modules 5 respectively arranged adjacent to the two heat treatment modules 40.

The loading/unloading unit 31 includes a normal pressure transfer chamber 33 where a normal pressure atmosphere is maintained and a first substrate transfer unit 32 is disposed therein, and a carrier mounting table 35 disposed on one side of the normal pressure transfer chamber 33 and configured to mount thereon carriers 34 each accommodating wafers W. A reference numeral '36' in FIG. 5 denotes an orienter provided at a lateral side end of the normal pressure transfer chamber 33. In the orienter 36, the eccentric amount of the wafer W is optically calculated by rotating the wafer W and the position alignment of wafer W with respect to the first substrate transfer unit 32 is performed. The first substrate transfer unit 32 transfers the wafers W among the carriers 34 on the carrier mounting table 35, the orienter chamber 36, and the two load-lock chambers 41.

A second substrate transfer unit 42 having, e.g., an articulated arm structure, is disposed in each of the load-lock chambers 41 to transfer the wafer W among the load-lock chamber 41, the heat treatment module 40 and the etching module 5. The atmosphere in the processing chamber forming the heat treatment module 40 and the atmosphere in the processing chamber forming the etching module 5 are set to the vacuum atmosphere. The atmosphere in each of the load-lock chambers 41 is switched between the normal pressure atmosphere and the vacuum atmosphere so that the wafer W can be transferred between the processing chambers having the vacuum atmosphere and the normal pressure transfer chamber 33.

Figure 5:
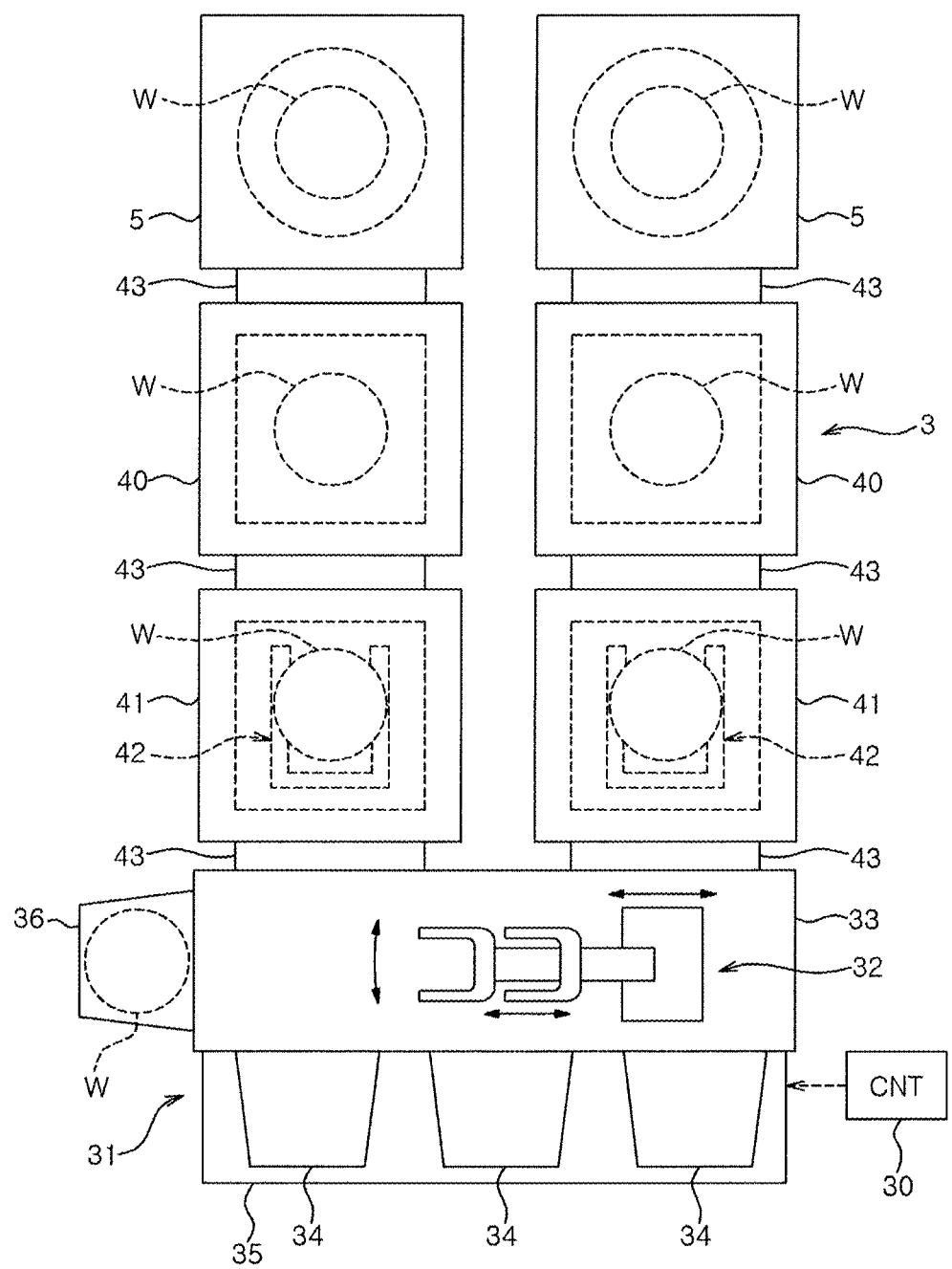
FIG. 5 is a plan view of a substrate processing apparatus for performing the etching.

A reference numeral '43' in FIG. 5 denotes gate valves disposed between the normal pressure transfer chamber 33 and the load-lock chambers 41, between the load-lock chambers 41 and the heat treatment modules 40, and between the heat treatment modules 40 and the etching modules 5. Each heat treatment module 40 includes the above-described processing chamber, a gas exhaust unit for evacuating the processing chamber to form a vacuum atmosphere, and a mounting table that is disposed in the processing chamber and capable of heating the wafer W mounted thereon, for example. The heat treatment module 40 is configured to execute step S5 described above.

Figure 6:
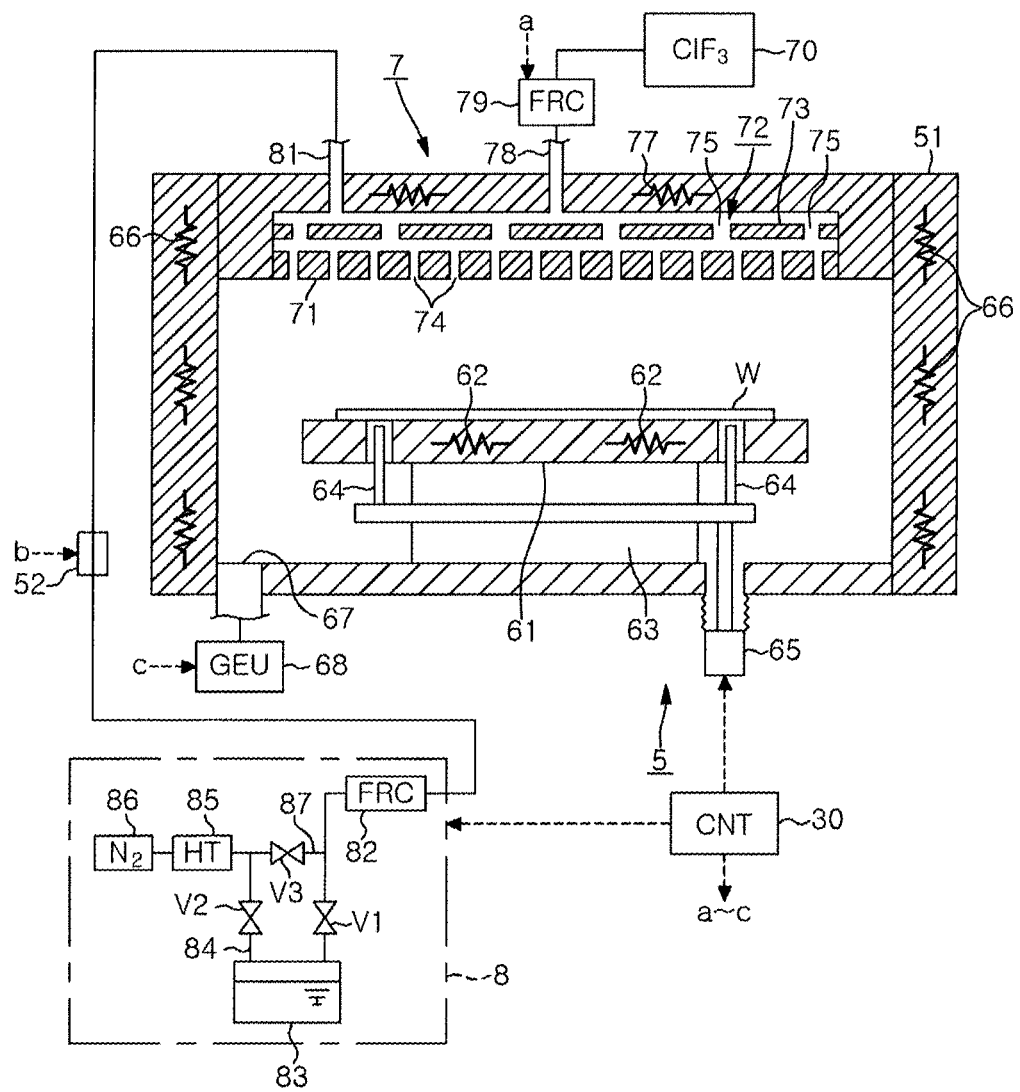
FIG. 6 is a longitudinal cross-sectional view of an etching module provided in the substrate processing apparatus.

Next, the etching module 5 will be described with reference to FIG. 6 showing a longitudinal cross-sectional view thereof. The etching module 5 performs the processes of steps S1 to S4 on the wafer W. The etching module 5 includes, e.g., a cylindrical processing chamber 51. In other words, the processes of steps S1 to S4 are performed in the same (single) processing chamber. The processing chamber 51 is an airtight vacuum chamber. A cylindrical mounting table 61 for mounting the wafer W on a horizontal surface (top surface) thereof is disposed at a lower portion of the processing chamber 51. A reference numeral '62' in FIG. 6 denotes a stage heater embedded in the mounting table 61. The stage heater 61 heats the wafer W to a predetermined temperature so that the processes in steps S1 to S4 can be performed. A reference numeral '63' in FIG. 6 denotes a support column for supporting the mounting table 61 serving as a mounting unit on the bottom surface of the processing chamber 51. A reference numeral '64' in FIG. 6 denotes a lift pin that protrudes beyond and retracts below the surface of the mounting table 61 by a lift mechanism 65 to transfer the wafer W between the second substrate transfer unit 42 and the mounting table 61. Although three lift pins 64 are provided, only two lift pins 64 are illustrated.

A reference numeral '66' in FIG. 6 denotes a sidewall heater disposed in the sidewall of the processing chamber 51. The sidewall heater 66 is configured to adjust the temperature of the atmosphere in the processing chamber 51. In addition, a transfer port (not shown) for transferring the wafer W therethrough is disposed at the sidewall of the processing chamber 51. A reference numeral '67' in FIG. 6 denotes a gas exhaust port formed at the bottom surface of the processing chamber 51. The gas exhaust port 67 is connected to a gas exhaust unit (GEU) 68 including a vacuum pump and a valve through a gas exhaust line. The pressure in the processing chamber 51 is adjusted by adjusting the flow rate of the exhaust gas exhausted from the gas exhaust port 67 by the gas exhaust unit 68.

A gas shower head 7 serving as an amine gas supply unit and an etching gas supply unit is disposed above the mounting table 61 at the ceiling portion of the processing chamber 51 to be opposed to the mounting table 61. The gas shower head 7 includes a shower plate 71, a gas diffusion space 72, and a diffusion plate 73. The shower plate 71 is disposed horizontally to form the bottom surface portion of the gas shower head 7. A plurality of gas injection holes 74 is distributed in the shower plate 71 to inject a gas to the mounting table 61 in a shower pattern. The gas diffusion space 72 is a flat space whose lower part is partitioned by the shower plate 71 to supply the gas to the gas injection holes 74. The diffusion plate 73 is disposed horizontally to divide the gas diffusion space 72 into an upper space and a lower space. A reference numeral '75' in FIG. 6 denotes a through-hole formed in the diffusion plate 73. A plurality of through-holes is formed through the diffusion plate 73. A reference numeral '77' in FIG. 6 denotes a ceiling heater for adjusting the temperature of the gas shower head 7.

Downstream ends of gas supply lines 78 and 81 are connected to an upper portion of the gas diffusion space 72. An upstream end of the gas supply line 78 is connected to a ClF$_3$ gas supply source 70 through a flow rate controller (FRC) 79. The flow rate controller 79 includes a valve or a mass flow controller and adjusts a flow rate of a gas to be supplied toward the downstream side of the gas supply line 78. Respective flow rate controllers to be described below are configured in the same manner as the flow rate controller 79, and each of the flow rate controllers adjusts a flow rate of a gas to be supplied to the downstream side of a line installed in the corresponding flow rate controller.

An upstream side of the gas supply line 81 is connected to a vaporizing unit 83 through a flow rate controller (FRC) 82 and a valve V1 in that order. The above-described hexylamine is stored in a liquid state in the vaporizing unit 83. The vaporizing unit 83 includes a heater (not shown) for heating the hexylamine. In addition, one end of a gas supply line 84 is connected to the vaporizing unit 83 and the other end of the gas supply line 84 is connected to a nitrogen (N$_2$) gas supply source 86 through a valve V2 and a gas heating unit (HT) 85 in that order. With this configuration, the heated N$_2$ gas is supplied to the vaporizing unit 83 and the hexylamine stored in the vaporizing unit 83 is vaporized. The vaporized amine is supplied as the amine gas to the gas shower head 7 together with the N$_2$ gas used for the vaporization.

Further, in the gas supply line 84, a downstream side of the gas heating unit 85 and an upstream side of the valve V2 is branched to form a gas supply line 87. One end portion of the gas supply line 87 is connected to a downstream side of the valve V1 and an upstream side of the flow rate controller 82 in the gas supply line 81 through a valve V3. Therefore, when the amine gas is not supplied to the gas shower head 7, the N$_2$ gas heated by the gas heating unit 85 can be supplied to the gas shower head 7 while bypassing the vaporizing unit 83.

A line heater 52 for heating a line is disposed to surround the gas supply line 81 to prevent liquefaction of the amine gas that is being circulated. The temperature of the amine gas injected from the gas shower head 7 is adjusted by the line heater 52, the gas heating unit 85, and the heater disposed in the vaporizing unit 83. For the sake of convenience in illustration, the line heater 52 is disposed only at a part of the gas supply line 81. However, the line heater 52 is disposed over a relatively wide range of the line to prevent the liquefaction. The flow rate controller 82, the vaporizing unit 83, the valves V1 to V3, the gas supply line 84, the gas heating unit 85, and the N$_2$ gas supply source 86 provided on the upstream side of the flow rate controller 82 in the gas supply line 81 constitute a gas supply unit 8.

Next, the gases supplied from the gas shower head 7 in steps S1 to S4 executed in the etching module 5 will be described. In step S1, the amine gas and the N$_2$ gas used for vaporizing the amine gas are supplied from the gas supply unit 8 to the gas shower head 7 and then supplied into the processing chamber 51. In steps S2 and S4, the N$_2$ gas is supplied from the gas supply unit 8 to the gas shower head 7 and then supplied as a purge as into the processing chamber 51. In step S3, the supply of the gas from the gas supply unit 8 is stopped, and the ClF$_3$ gas is supplied from the ClF$_3$ gas supply source 70 to the gas shower head 7 and then supplied into the processing chamber 51.

Meanwhile, as shown in FIGS. 5 and 6, the substrate processing apparatus 3 further includes a controller (CNT) 30 that is a computer. The controller 30 includes a program, a memory, and a CPU. The program stores instructions (respective steps) to process and transfer the wafer W as described above. The program is stored in a computer storage medium such as a compact disk, a hard disk, a magneto-optical disk, a DVD, or the like, and is installed in the controller 30. The controller 30 outputs control signals to respective units of the substrate processing apparatus 3 based on the program and controls the operations of the respective units based on the control signals. Specifically, the control signals control the operations of the etching modules 5, the heat treatment modules 40, the first substrate transfer unit 32, the second substrate transfer unit 42, and the orienter. The operation of the etching modules 5 includes the output adjustment of each heater, the supply and the supply stop of the gases from the gas shower head 7, the adjustment of the flow rate of the exhaust gas exhausted by the gas exhaust unit 68, the vertical movement of the lift pins 64 by the lift mechanism 65, and the like. A combination of the controller 30 and the etching module 5 constitutes an etching apparatus.

The transfer path of the wafer W in the substrate processing apparatus 3 will be described. The carrier 34 storing the wafer W having the respective films described in FIG. 1 is mounted on the carrier mounting table 35. The wafer W is transferred in the order of the normal pressure transfer chamber 33→the orienter 36→the normal pressure transfer chamber 33→the load-lock chamber 41 and transferred to the etching module 5 through the heat treatment module 40. Thereafter, as described above, the wafer W is processed by repeatedly executing the cycle of steps S1 to S4. Then, the wafer W is transferred to the heat treatment module 40 and subjected to the process of step S5. Thereafter, the wafer W is transferred in the order of the load-lock chamber 41→the normal pressure transfer chamber 33 and is returned to the carrier 34.

The supply of the amine gas and the supply of the etching gas may be performed in different processing chambers, and the wafer W may be transferred between the different processing chambers by a transfer unit. However, in the case of supplying these gases in the same processing chamber, a time period required for transferring the wafer W between the modules can be reduced when repeatedly executing the above-described cycle. Therefore, the substrate processing apparatus 3 of the present embodiment can improve the throughput.

The amine gas and the etching gas may be simultaneously supplied into the processing chamber 51. In other words, the polysilicon film 14 may be etched while supplying the amine 21 to the pores 16 of the SiOCN film 15. In this case, the purge gas is supplied to purge the inside of the processing chamber 51 after the amine gas and the etching gas are supplied. Further, the supply of the amine gas and the etching gas and the supply of the purge gas after the supply of the amine gas and the etching gas may be set to one cycle, and a single wafer W may be processed by repeatedly executing the cycle. Further, in the above-described example, the amine gas and the etching gas are injected from the same gas shower head 7 toward the wafer W. However, the present disclosure is not limited thereto. For example, it is also possible to provide a gas nozzle at the processing chamber 51, in addition to the gas shower head 7, and inject one of the amine gas and the etching gas from the gas nozzle. Further, in the above-described example, the polysilicon film 14, the SiOCN film 15, and the SiGe film 11 are horizontally arranged side by side. However, the present disclosure may be applied to the case where the polysilicon film 14, the SiOCN film 15, and the SiGe film 11 are stacked vertically.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof (Evaluation Tests)

Evaluation tests conducted in connection with the embodiment of the present disclosure will be described.

Evaluation Test 1

In the evaluation test 1, dry etching was performed on the polysilicon films 14 of a plurality of wafers W, each having the film structure shown in FIG. 1, by using a test apparatus that is configured to supply various gases into the processing chamber 51 having a vacuum atmosphere, similar to the etching module 5. The wafer W before the etching had the polysilicon film 14 with a thickness of 130 nm and the silicon oxide film 12 with a thickness of 80 nm. The etching was performed by supplying a mixed gas of $ClF_3$ gas and $N_2$ gas into the processing chamber 51 in a state where a pressure in the processing chamber 51 was set to be in a range from 0.1 Torr (13.3 Pa) to 10 Torr (1333 Pa). The $ClF_3$ gas was supplied into the processing chamber 51 at a flow rate of 50 sccm to 400 sccm, and the $N_2$ gas was supplied into the processing chamber 51 at a flow rate of 100 sccm to 1000 sccm. Depending on the wafers W, a gas other than the etching gas was supplied between the etching processes. The gas supply process between the etching processes is a sealing process for preventing the etching gas from passing through the pores 16 of the SiOCN film 15. The sealing process was performed in a state where the pressure in the processing chamber 51 was set to be in a range from 0.1 Torr (13.3 Pa) to 10 Torr (1333 Pa).

A test cycle includes the sealing process of 120 seconds and the subsequent etching process of 90 seconds. In evaluation tests 1-1 and 1-2, the etching process was performed for 90 seconds and, then, the test cycle was executed twice. In an evaluation test 1-3, the etching process was performed for 90 seconds and, then, the test cycle was executed three times. In an evaluation test 1-4, the etching process was performed for 90 seconds and, then, the etching process was further performed for 30 seconds. In an evaluation test 1-5, the etching process was performed for 90 seconds, and the etching process was further performed for 30 seconds, and then the etching process was consecutively further performed for 30 seconds. Therefore, the sealing process was not performed in the evaluation tests 1-4 and 1-5.

In the sealing process of the evaluation test 1-1, hexylamine was used as in the above-described embodiment. More specifically, the sealing process of the evaluation test 1-1 was performed by supplying hexylamine as the amine gas together with argon (Ar) gas. The amine gas is supplied at a flow rate of 10 sccm to 500 sccm and the Ar gas is supplied at a flow rate of 100 sccm to 1000 sccm into the processing chamber 51. Further, the sealing process of the evaluation test 1-2 was performed in the same manner as the sealing process of the evaluation test 1-1, except that a tert-butyl isocyanate gas was used instead of the hexylamine gas. The sealing process of the evaluation test 1-3 was performed in the same manner as the sealing process of the evaluation test 1-1 except that the hexylamine gas was supplied at a flow rate of 10 sccm to 500 sccm into the processing chamber; the tert-butyl isocyanate gas was supplied at a flow rate of 10 sccm to 500 sccm into the processing chamber; and Ar gas was supplied at a flow rate of at 100 sccm to 1000 sccm into the processing chamber. Therefore, in the evaluation test 1-3, the etching in the test cycle was performed in a state where the pores 16 of the SiOCN film 15 are sealed with a compound having a urea bond generated from a compound of these gases.

In the wafers W processed in the evaluation tests 1-1 to 1-5, the etching amount (the thickness of the etched polysilicon film 14), the thickness of the remaining polysilicon film 14, and the damages of the sidewall of the SiGe film 11 were examined. Hereinafter, the results thereof will be described. In the wafer W of the evaluation test 1-1, the etching amount was in a range from 120 nm to 130 nm; the thickness of the remaining polysilicon film 14 was 10 nm or less; and the sidewall of the SiGe film 11 was hardly damaged. In the wafer W of the evaluation test 1-2, the etching amount was 130 nm; the thickness of the remaining polysilicon film 14 was 0 nm; and the sidewall of the SiGe film 11 was damaged. In the wafer W of the evaluation test 1-3, the etching amount was in a range from 120 nm to 130 nm; the thickness of the remaining polysilicon film 14 was 10 nm or less; and the sidewall of the SiGe film 11 was hardly damaged. Here, the damage of the wafer W in the evaluation test 1-1 was smaller than that in the evaluation test 1-3. In the wafer W of the evaluation test 1-4, the etching amount was 90 nm; the thickness of the remaining polysilicon film 14 was 40 nm or less; and the sidewall of the SiGe film 11 was damaged. In the wafer W of the evaluation test 1-5, the etching amount was 120 nm; the thickness of the remaining polysilicon film 14 was 10 nm; and the sidewall of the SiGe film 11 was damaged.

In the case of comparing the results of the evaluation tests 1-1 and 1-3, the etching time is longer in the evaluation test 1-3 because the number of execution of the test cycle is greater in the evaluation test 1-3. However, the etching amount in the evaluation test 1-1 is substantially the same as that in the evaluation test 1-3. Further, as described above, the damage of the SiGe film 11 is smaller in the evaluation test 1-1. In the case of comparing the results of the evaluation tests 1-1 and 1-2, the etching amount is greater in the evaluation test 1-2, and the damage of the SiGe film 11 is greater in the evaluation test 1-2. In the case of comparing the results of the evaluation test 1-1 and the evaluation tests 1-4 and 1-5, the damage of the SiGe film 11 is suppressed in the evaluation test 1-1, compared with the evaluation tests 1-4 and 1-5. Further, although the etching time in the evaluation test 1-1 is not the same as that in the evaluation test 1-5, the etching amount is substantially the same as each other.

From the result of the evaluation test 1, it is clear that the damages of the SiGe film 11 can be suppressed by supplying the amine gas to the wafer W and supplying the etching gas in a state where the amine gas is adsorbed onto the SiOCN film 15. In other words, the effects of the process according to the above-described embodiment were confirmed from the result of the evaluation test 1. It is also clear that the etching amount is not substantially affected by the supply of the amine gas.

Evaluation Test 2

In an evaluation test 2-1, a wafer W made of silicon (Si) having a clean surface was loaded into in a processing chamber of the test apparatus, and the processing chamber was set to a vacuum atmosphere. Then, a tert-butylamine gas was supplied for 5 minutes. Thereafter, an $IF_7$ gas was supplied to the wafer W for one minute. Next, an annealing process for heating the wafer W at a temperature of 100° C. to 400° C. was performed for 5 minutes. An evaluation test 2-2 was executed under the same conditions as those of the evaluation test 2-1 except that a tert-butyl isocyanate gas was supplied for one minute instead of the tert-butylamine gas. In the evaluation tests 2-1 and 2-2, the images of the surfaces of the wafers after the supply of the tert-butylamine gas or the tert-butyl isocyanate gas and before the supply of the $IF_7$ gas, after the supply of the $IF_7$ gas and before the annealing process, and after the annealing process. In addition, the difference in the weight of the wafer W before and after the supply of the $IF_7$ gas was measured.

Figure 7:
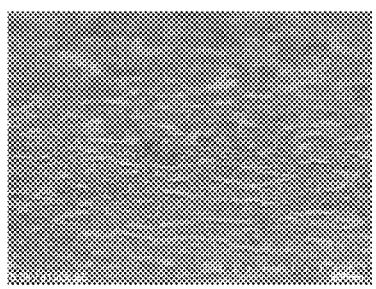
FIG. 7 is an explanatory view showing images obtained in evaluation tests.
Figure 7:
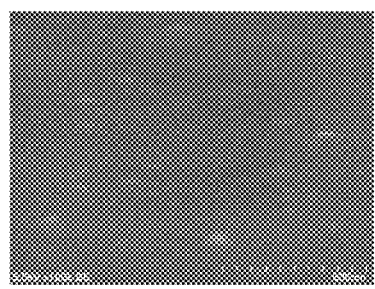
Figure 7:
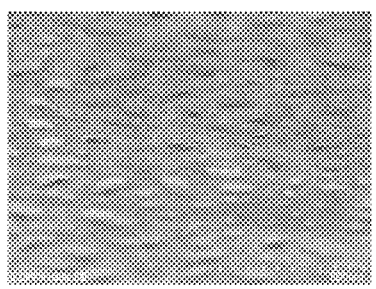
Figure 7:
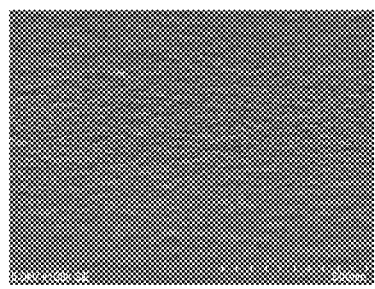
Figure 7:
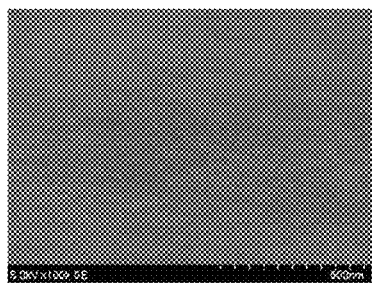
Figure 7:
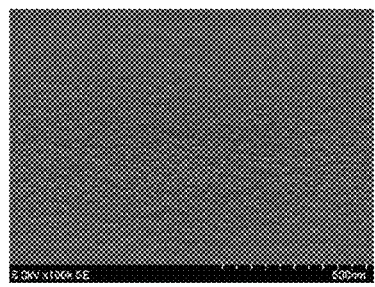

FIG. 7 shows the images of the wafers W obtained in the evaluation test 2. The images vertically arranged on the left side of FIG. 7 were obtained in the evaluation test 2-1 and the images vertically arranged on the right side of FIG. 7 were obtained in the evaluation test 2-2. The images on the upper row were obtained after the supply of the tert-butylamine gas or tert-butyl isocyanate gas and before the supply of the $IF_7$ gas; the images on the intermediate row were obtained after the supply of the $IF_7$ gas and before the annealing process; and the images on the lower row were obtained after the annealing process.

The image on the upper row and the image on the intermediate row obtained in the evaluation test 2-1 show that the surface state of the wafer W was changed by the supply of the $IF_7$ gas. This is because the film was formed by the reaction products of the tert-butylamine gas and the $IF_7$ gas. Further, the image on the lower row obtained in the evaluation test 2-1 show that the surface of the wafer W was exposed. In other words, the film formed by the reaction products was removed by the annealing process. The damages from the etching were not observed on the exposed surface of the wafer W in the image on the lower row. On the other hand, the image on the upper row and the image on the intermediate row obtained in the evaluation test 2-2 show that the film of the reaction products like in the evaluation test 2-1 was not formed. Further, it was found that the surface of the wafer W was rough due to the damages from the etching, compared to that in the image on the lower row obtained in the evaluation test 2-1.

Further, in the evaluation test 2-1, the weight of the wafer W after the supply of the $IF_7$ gas was greater than that before the supply of the $IF_7$ gas by 19 ppm. This result indicates that the film of the reaction products was formed and the etching of the surface of the wafer W was suppressed. On the other hand, in the evaluation test 2-2, the weight of the wafer W after the supply of the $IF_7$ gas was smaller than that before the supply of the $IF_7$ gas by 118 ppm. This result indicates that the surface of the wafer W was etched as described above.

The evaluation test 2 shows that the etching of the surface of the wafer W can be suppressed by supplying the amine gas to the wafer W and forming the film of the reaction products generated by the reaction between the amine gas and the $IF_7$ gas that is the etching gas. The etching of the surface of the wafer W was suppressed because the etching property of the $IF_7$ gas on the surface of the wafer W was deactivated by the reaction products and the surface of the wafer W was protected from the $IF_7$ gas by the film of the reaction products. Therefore, it is clear from the evaluation test 2 that the etching of the SiGe film 11 can be suppressed by performing the sealing process for supplying the amine gas to the SiOCN film 15 as in the above-described embodiment. In the evaluation test 2, the $IF_7$ gas was used as the etching gas. However, a $ClF_3$ gas also relatively easily reacts with amine and reaction products are easily generated by the reaction therebetween, as will be described in the following evaluation test 4. Therefore, in the case of using the $ClF_3$ gas, the etching of the SiGe film 11 can be suppressed.

Evaluation Test 3

In the evaluation test 3, for ammonia ($NH_3$), butylamine, hexylamine, and trimethylamine, each of which is a molecule containing N (nitrogen), the adsorption energies thereof to various Si-containing molecules were measured by simulation. Specifically, the adsorption energies thereof to silicon (Si), silicon carbide (SiC), silicon nitride (SiN), $SiO_2CN$, and silicon oxide (SiO) were measured.

Figure 8:
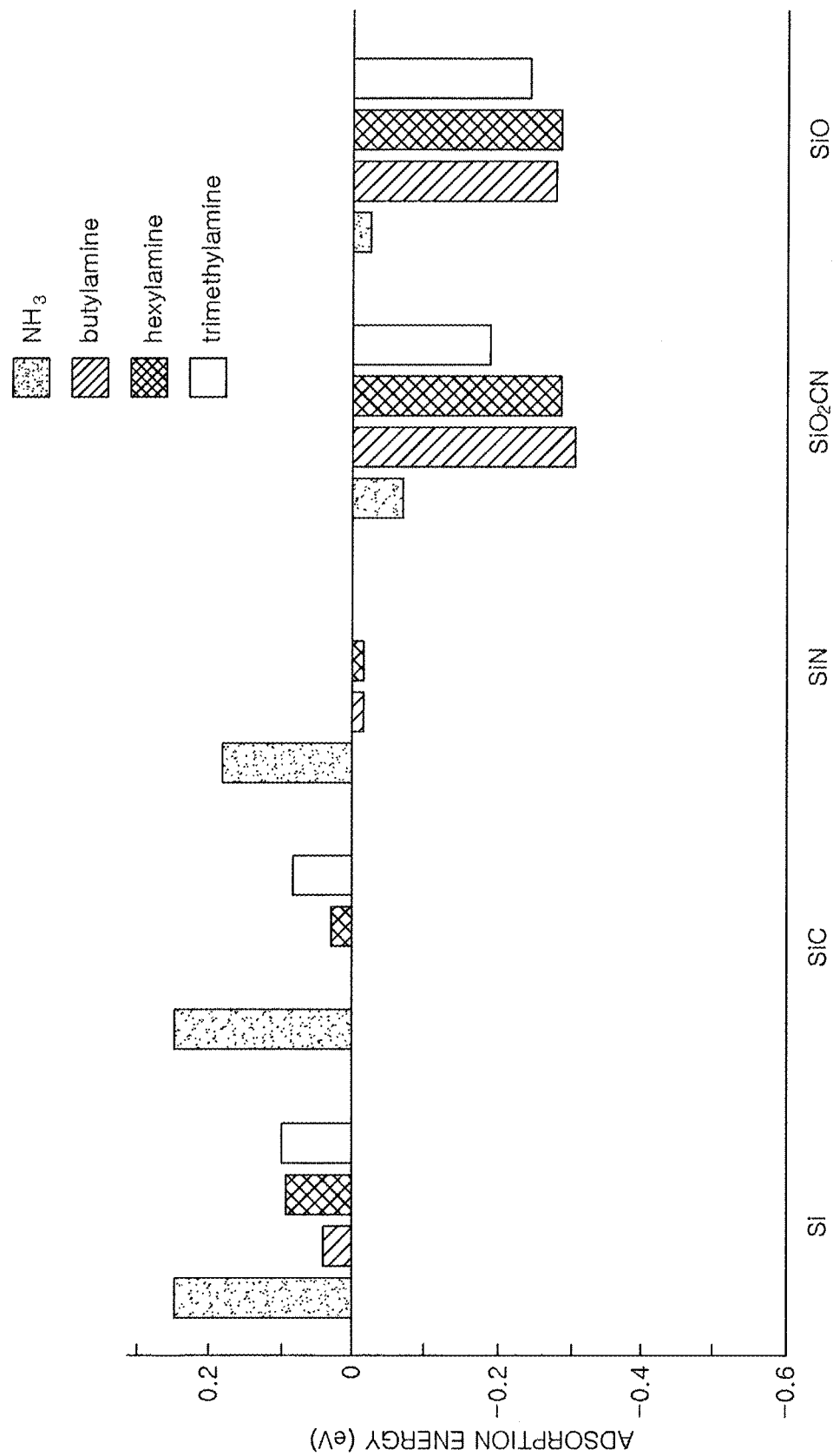
FIG. 8 is a graph showing results of the evaluation tests.

FIG. 8 is a bar graph showing the result of the evaluation test 3. The vertical axis of the graph represents the adsorption energy (unit: eV). The adsorption becomes easier as the adsorption energy becomes lower. As shown in FIG. 8, all of NH$_3$, butylamine, hexylamine and trimethylamine are hardly adsorbed onto Si, SiC and SiN. However, all of NH$_3$, butylamine, hexylamine and trimethylamine are easily adsorbed onto SiO$_2$CN and SiO. This is because the amine and the ammonia have oxygen atoms as adsorption sites.

Therefore, the result of the evaluation test 3 shows that amine supplied to the SiOCN film 15 in the above-described embodiment is relatively easily adsorbed onto the SiOCN film 15 because the SiOCN film 15 contains oxygen atoms. In other words, when the etching gas is supplied, the etching gas is prevented from passing through the pores 16 as described above because the amine remains in the pores 16 of the SiOCN film 15. In other words, the effects of the process according to the above-described embodiment were confirmed from the result of the evaluation test 3.

Evaluation Test 4

In the evaluation test 4, the activation energy (unit: eV) and the amount of change in the free energy (unit: eV) in the case of reacting each of butylamine, hexylamine, and decylamine with ClF$_3$ were calculated. In the reaction between ClF$_3$ and butylamine, the activation energy was 0.889 eV and the amount of change in the free energy was −1.018 eV. In the reaction between ClF$_3$ and hexylamine, the activation energy was 0.888 eV and the amount of change in the free energy was −1.019 eV. In the reaction between ClF$_3$ and decylamine, the activation energy was 0.888 eV and the amount of change in the free energy was −1.022 eV. As a comparative example, in the case of reacting ClF$_3$ with NH$_3$, the activation energy was 1.559 eV and the amount of change in the free energy was −0.492 eV.

As a result, in the case of using butylamine, hexylamine, or decylamine, the activation energy is relatively low and the change in the free energy of the reaction has a negative value whose absolute value is relatively large. In other words, the reactivity between ClF$_3$ and these amines is high. Therefore, in the case of using the ClF$_3$ gas as the etching gas, it is possible to decrease the etching activity of the etching gas and to form the protective film as in the evaluation test 2 by sealing the SiOCN film 15 using these amines. Accordingly, the effects of the process according to the above-described embodiment were confirmed from the result of the evaluation test 4.

From the evaluation tests described above, it is clear that the etching of the silicon-containing film in the above-described embodiment can be suppressed by performing the sealing process using various amines. The amine used for the sealing process in the above-described embodiment is not limited. Specifically, the amine may be, e.g., butylamine, hexylamine, dipropylamine, n-octylamine, tert-butylamine, decylamine, dodecylamine, dicyclohexylamine, tetradecylamine, or the like. The boiling point of the above-described amines is within a range of 100° C. to 400° C. Therefore, it is preferable to heat the wafer W to a temperature of 100° C. to 400° C. to vaporize and remove the amine from the SiOCN film 15 in step S5 of the above-described embodiment.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. An etching method for etching a silicon-containing film formed in a substrate by supplying an etching gas to the substrate, the method comprising:
  supplying only an amine gas to the substrate, in which the silicon-containing film, a porous film, and a non-etching target film that is a film not to be etched but is etchable by the etching gas are sequentially formed adjacent to each other, so that amine is adsorbed onto walls of pores of the porous film; and
  supplying the etching gas for etching the silicon-containing film to the substrate in which the amine is adsorbed onto the walls of the pores of the porous film,
  wherein the silicon-containing film, the porous film, and the non-etching target film are horizontally adjacent to each other, and an etching mask film is formed on the non-etching target film.

2. The method of claim 1, further comprising:
  repeating the supplying of the amine gas and the supplying of the etching gas, in that order, multiple times.

3. The method of claim 2, further comprising:
  exhausting an atmosphere around the substrate between the supply of the amine gas and the supply of the etching gas.

4. The method of claim 2, further comprising:
  after the supplying of the amine gas and the supplying of the etching gas, heating the substrate to remove the amine from the pores of the porous film.

5. The method of claim 4, wherein in the heating the substrate, the substrate is heated to a temperature ranging from 100° C. to 400° C.

6. The method of claim 2, wherein the porous film is an oxygen-containing film.

7. The method of claim 1, further comprising:
  exhausting an atmosphere around the substrate between the supply of the amine gas and the supply of the etching gas.

8. The method of claim 1, further comprising:
  after the supplying of the amine gas and the supplying of the etching gas, heating the substrate to remove the amine from the pores of the porous film.

9. The method of claim 8, wherein in the heating the substrate, the substrate is heated to a temperature ranging from 100° C. to 400° C.

10. The method of claim 1, wherein the porous film is an oxygen-containing film.

* * * * *